United States Patent
Chieu (10) Patent No.: US 10,393,802 B2
(45) Date of Patent: Aug. 27, 2019

(54) SYSTEM AND METHOD FOR ADAPTIVE TESTING OF SEMICONDUCTOR PRODUCT

(71) Applicant: Nuvoton Technology Corporation, Hsinchu (TW)

(72) Inventor: Long Chieu, San Jose, CA (US)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 17 days.

(21) Appl. No.: 15/623,366

(22) Filed: Jun. 14, 2017

(65) Prior Publication Data

US 2018/0364302 A1    Dec. 20, 2018

(51) Int. Cl.
| | |
|---|---|
| G01R 31/30 | (2006.01) |
| G06F 11/10 | (2006.01) |
| G01R 31/28 | (2006.01) |
| G01R 31/317 | (2006.01) |

(52) U.S. Cl.
CPC ....... *G01R 31/2894* (2013.01); *G01R 31/287* (2013.01); *G01R 31/31707* (2013.01); *G01R 31/31718* (2013.01)

(58) Field of Classification Search
CPC .......... G01R 31/2894; G01R 31/31707; G01R 31/31718
See application file for complete search history.

(56) References Cited

U.S. PATENT DOCUMENTS

| | | | | |
|---|---|---|---|---|
| 2007/0233629 A1* | 10/2007 | Balog | ............ | G01R 31/318314 706/47 |
| 2011/0000829 A1* | 1/2011 | Linde | ...................... | B07C 5/344 209/571 |

* cited by examiner

*Primary Examiner* — Samir W Rizk
(74) *Attorney, Agent, or Firm* — Kilpatrick Townsend & Stockton, LLP (57) ABSTRACT

A method for testing a plurality of electronic devices includes performing tests of up to m devices at a time to measure device parameters on a device tester configured to test up to m devices at a time, where m is an integer. After each test, the method includes performing statistical analysis of the measured device parameters for all tested devices to determine statistical data, including updated mean and standard deviation for each parameter, and storing only the statistical data, and not the measured device parameters. The method further includes determining new pass/fail limits for each device parameter based on the updated mean and standard deviation, and determining pass or fail of each device based on the new pass/fail limits for each device parameter.

19 Claims, 7 Drawing Sheets

SYSTEM AND METHOD FOR ADAPTIVE TESTING OF SEMICONDUCTOR PRODUCT

BACKGROUND OF THE INVENTION

This invention relates to the field of semiconductor technology. More particularly, embodiments of this invention are directed to methods and systems for production testing of semiconductor devices.

Semiconductor test practices can vary greatly in the industry. Automated test equipment (ATE) are often used to handle and test many different semiconductor product lines for various kinds of end users, e.g., consumer, automotive, and military devices. The amount of data produced in testing one device under test (DUT) can range from as little as 5 KB to as much as 1 MB and typically only takes a few seconds to test one DUT. Multiply this times the run rate of a small production facility, e.g., 20 or more ATEs running 24 hours/day 7 days a week, and the produced test data can reach 2 TeraBytes ($2.0 \times 10^{12}$ bytes) in one month.

Storage of the large amount of data can become costly. However, sorting, shifting, and managing all that data can require a team of engineers to analyze. Managing the data can becomes a big production challenge. In most cases, the industry may even choose not to output and store the data, because of the storage needed as well as the increased time it takes for the ATEs to produce these data files. In many cases there simply may not be data available for a particular product and not enough engineering staff to analyze the available data.

Therefore, improved methods and systems that address some of the limitations described above is desired.

BRIEF SUMMARY OF THE INVENTION

Some embodiments of the present invention are directed to a system and a method of tracking production test data for semiconductor products during factory testing on an automated test system. The process can occur at real-time as the DUTs (devices under test) are run through the automated test system during a final test before shipping to end customers. In some embodiments, this method constantly tracks all measurements made during automated testing and creates real-time statistical data distribution for each test parameter. The method includes adjusting "PASS/FAIL" criteria for each test parameter based on statistical data that correlates process skews and normal distributions. As the semiconductor manufacturing process shifts within its normal distribution, so will the measured results of each device for each production test parameter. In some embodiments, the method dynamically and constantly updates the measured data during the production test.

In some embodiments, the method then marks units that occur outside the "normal" distribution as bad or defective DUTs, even if the DUT is within the specified tolerance of a "good" device according to preset hard pass/fail limits of device parameters. As a result, this method of marking potentially "good" units defective, creates a much lower DPM (defects per million) rate and improves the overall product reliability. In some embodiments, the method can dynamically adjust the pass/fail limits as more devices are tested.

Some embodiments of the present invention provide a system and a method for automatically tracking all production data related to each semiconductor product, automatically logging statistical data of test data parameters and adjusting testing procedures to exclude devices that are statistically different from the normal distribution. Benefits of this invention include tracking all production test and statistical data, and improving end-customer product by reducing product defects, which can be expressed as DPM (defects per million) rate.

According to some embodiments of the present invention, a system for testing a plurality of electronic devices includes a testing equipment, e.g., an automatic tester. The system also has a processor coupled to the automatic tester and a storage device coupled to the processor. The system is configured to perform tests of up to m devices at a time to measure device parameters on a device tester configured to test up to m devices at a time, where m is an integer. In an embodiment, m is equal to four, which means that the test can test four devices at one time. After each test, the system performs statistical analysis of the measured device parameters to determine updated statistical data for all tested devices, including updated mean and standard deviation for each parameter. The system stores only the statistical data, and not the measured device parameters. For first N devices, where N is an integer, each test further includes determining pass or fail of each device based on preset pass/fail limits for the device parameter. After the first N device, each subsequent test further includes determining new pass/fail limits for each device parameter based on the updated mean and standard deviation. The system then determines pass or fail of each device based on the new pass/fail limits for each device parameter.

In some embodiments of the above system, the new pass/fail limits for each device parameter are based on the updated mean plus and minus six standard deviations of each parameter.

In some embodiments, the new pass/fail limits for each device parameter are based on the updated mean plus and minus three standard deviations of each parameter.

In some embodiments, the integer N for the first N devices is selected to provide a sufficiently large number of tested devices for determining new statistical data of the device parameters. For example, N can be between 50 to 500. Alternatively, N can be between 500-3000 devices. In other embodiments, N can be larger than 3000.

In some embodiments, the statistical data can include a total number of devices tested, a number of failed devices, and a percentage of failed devices.

In some embodiments, the statistical data can include histograms of device parameters distributions.

In some embodiments, the statistical data comprises the updated mean plus and minus six standard deviations of each parameters.

The statistical data comprises the updated mean plus and minus three standard deviations of each parameter.

According to some embodiments of the invention, a method for testing a plurality of electronic devices includes performing tests of up to m devices at a time to measure device parameters on a device tester configured to test up to m devices at a time, where m is an integer. After each test, the method includes performing statistical analysis of the measured device parameters for all tested devices to determine statistical data, including updated mean and standard deviation for each parameter, and storing only the statistical data, and not the measured device parameters. The method further includes determining new pass/fail limits for each device parameter based on the updated mean and standard deviation, and determining pass or fail of each device based on the new pass/fail limits for each device parameter.

In some embodiments of the above method, the new pass/fail limits for each device parameter are based on the updated mean plus and minus six standard deviations of each parameter.

In some embodiments, the new pass/fail limits for each device parameter are based on the updated mean plus and minus three standard deviations of each parameter.

In some embodiments, for first N devices, where N is an integer, the method includes determining pass or fail of each device based on preset pass/fail limits for each device parameter. After the first N device, for each subsequent test, the method further includes determining new pass/fail limits for each device parameter based on the updated mean and standard deviation, and determining pass or fail of each device based on the new pass/fail limits for each device parameter.

In some embodiments, the integer N for the first N devices is selected to provide a sufficiently large number of tested devices for determining new statistical data of the device parameters. For example, N can be between 50 to 500. Alternatively, N can be between 500-3000 devices. In other embodiments, N can be larger than 3000.

A further understanding of the nature and advantages of the present invention may be realized by reference to the remaining portions of the specification and the drawings.

DETAILED DESCRIPTION OF THE INVENTION

Some embodiments of the present invention are directed to a system and a method of tracking production test data for semiconductor products during factory testing on an automated test system. The process can occur at real-time as the DUTs (devices under test) are run through the automated test system during a final test before shipping to end customers. In some embodiments, this method constantly tracks all measurements made during automated testing and creates real-time statistical data distribution for each test parameter. The method includes adjusting "PASS" criteria for each test parameter based on statistical data that correlates process skews and normal distributions. As the semiconductor manufacturing process shifts within its normal distribution, so will the measured results of each device for each production test parameter. In some embodiments, the method dynamically and constantly updates the measured data during production tests.

In some embodiments, the method then marks units that occur outside the "normal" distribution as bad or defective DUTs, even if the DUT is within the specified tolerance of a "good" device according to preset hard pass/fail limits of device parameters. As a result, this method of marking potentially "good" units defective, creates a much lower DPM (defects per million) rate and improves the overall product reliability. In some embodiments, the method can dynamically adjust the pass/fail limits as more devices are tested.

Embodiments of the invention can provide one or more of the following advantages.
1. On-the-fly data management. In other words, shrinking large sums of data into more manageable data sizes.
2. Real-time data analysis. Statistical data on all test parameters are constantly being stored (and outputted to a file) with statistical calculations.
3. Dynamic PAT testing to achieve low DPM rates. Real-time test limit conditions that constantly determine truly "different" parts by eliminating user defined standard deviation rates.

As described above, convention test methods have many drawbacks. As a further example, automotive grade products require stringent <10 DPM rates. To help achieve these low defect rates, PAT (part average test) is typically used in the production test programs. Current PAT method is a static method. This involves having static limits (lower/upper bound test limits) to fit a distribution typically outside the "+/−3 standard deviation" range. A problem with this method is the static limits generated usually comes from a relatively small samples size. As the production runs long term, process skews and other factors can cause invalid failures as the distribution shifts.

Figure 1:
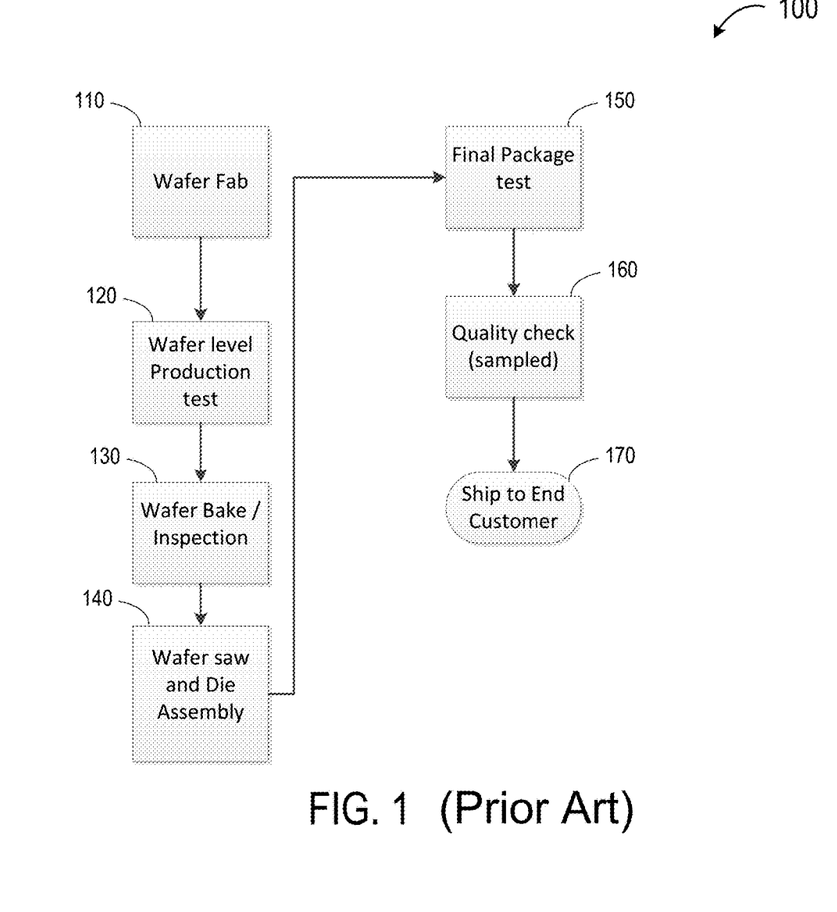
FIG. 1 is a simplified block diagram illustrating a conventional integrated circuit production testing system.

FIG. 1 is a simplified block illustrating a conventional integrated circuit production testing system. As shown in FIG. 1, in system 100, integrated circuit (IC) devices are fabricated in a wafer fabrication facility (110). A wafer level production test can be carried out (120). Next, a wafer bake and inspection process is carried out (130). Afterwards, the wafers are sawed into individual IC dies and the dies are assembled and packaged (140). In final package test (150), the package IC dies undergo extensive device testing, usually using automatic test equipment. Subsequently, a quality check is carried out (160), and the packaged IC dies are shipped to end customers (170).

Figure 2:
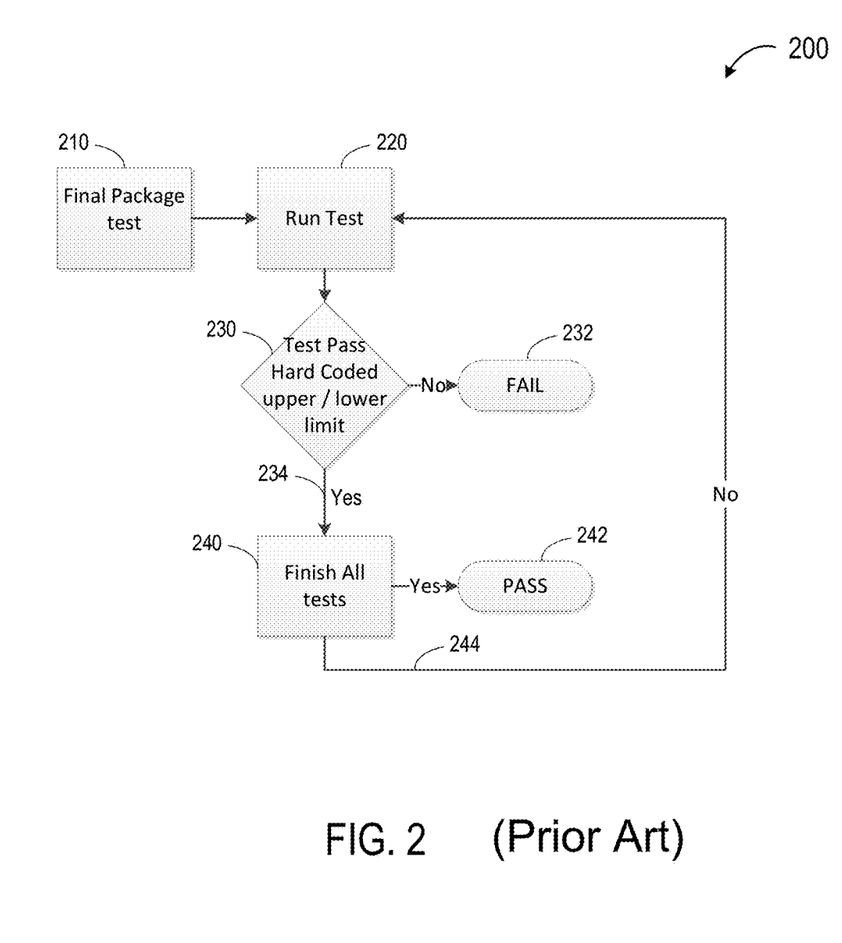
FIG. 2 is a simplified block diagram illustrating a final test stage of conventional integrated circuit production test system.

FIG. 2 is a simplified block diagram illustrating a final test stage of conventional integrated circuit production test system. As shown in FIG. 2, system 200, the final package test starts at 210, where packages device dies are ready for final testing. Various device tests are carried out at 220. The test results are analyzed to determine if the devices pass the hard codes upper and lower limits to determine if the device passes or fails the test (230). Here, if the measured device parameter falls outside the upper and lower limits, then the device is determined to have failed the test (232). If the measured device parameter falls between the upper and lower limits, then the device is determined to have passed the test (234). At this point, the system checks if all tests have been performed (240). If so, the devices have passed all tests (242). Otherwise, the system moves on to other tests (244).

Figure 3:
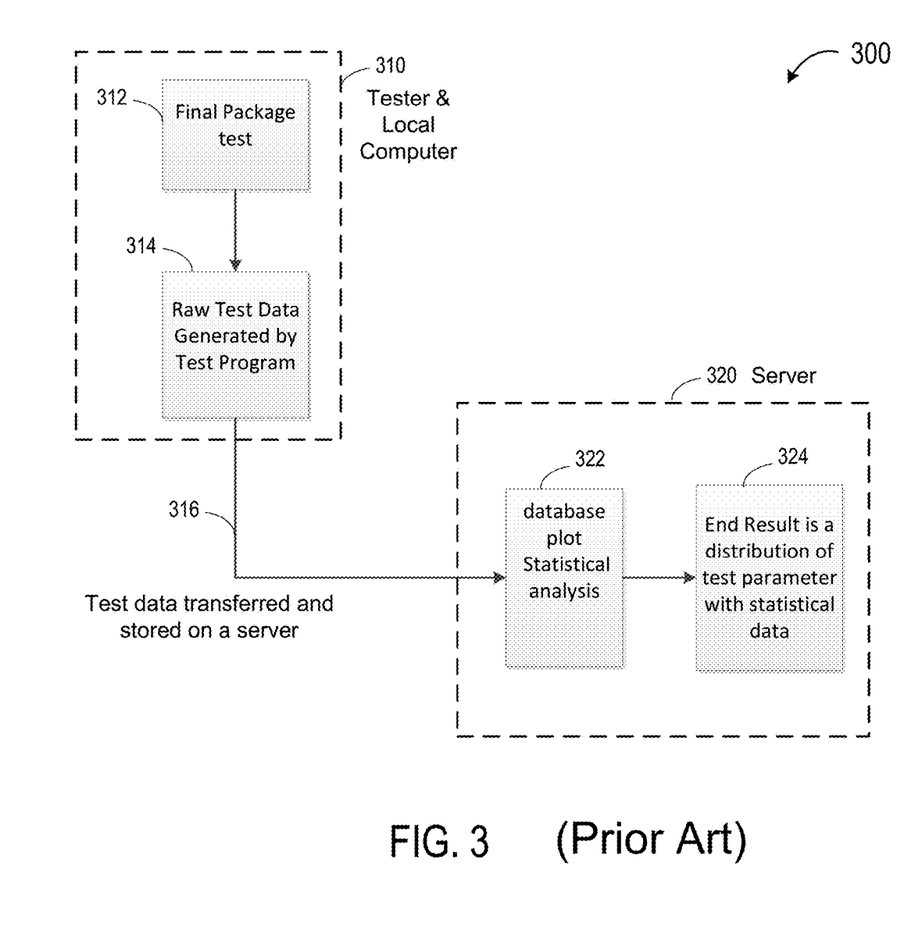
FIG. 3 is a simplified block diagram illustrating a conventional system for a final test stage of conventional integrated circuit production test.

FIG. 3 is a simplified block diagram illustrating a conventional system for a final test stage of conventional integrated circuit production test. As shown in FIG. 3, system 300 includes a local test system 310 and a server 320. Local test system 310 can include an automatic tester and local processor (not shown). In the local test system 310, final package test is carried out (312), and raw test data is generated (314). At this point, large amount of raw test data is transferred to server 320 (316). Server 320 can have multiple processors and storage units (not shown). At server 320, the raw data is stored in a database, analyzed, and plotted (322). Server 320 will produce a distribution of test parameters with statistical data 324. It can be seen that system 300 requires hardware servers and software to manage the data.

Figure 4:
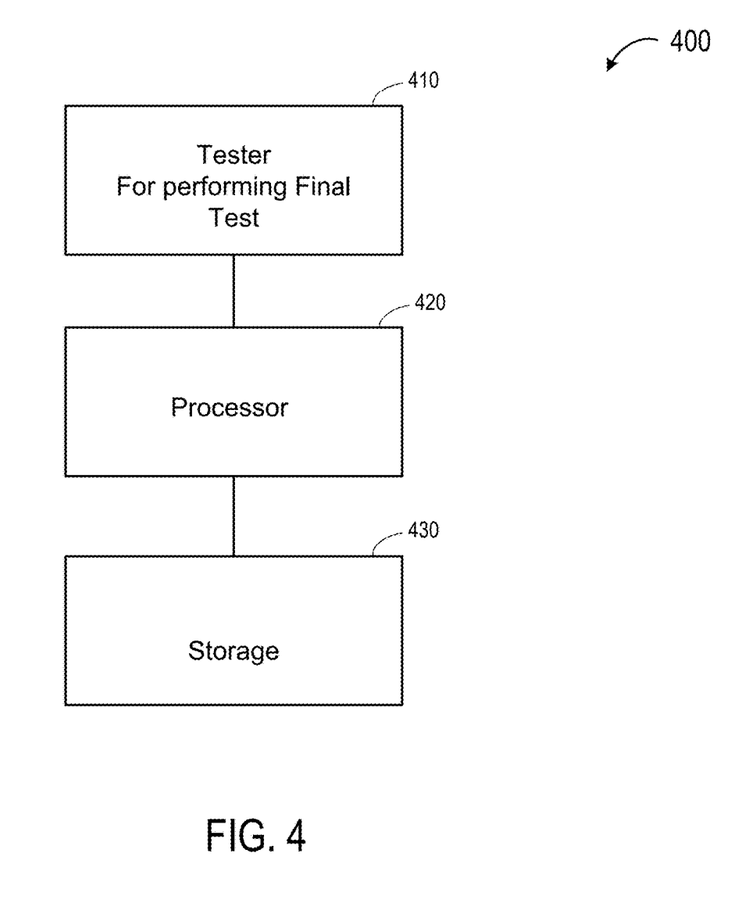
FIG. 4 is a simplified block diagram illustrating a system for a semiconductor final production test of integrated circuit production test according to some embodiments of the present invention.

FIG. 4 is a simplified block diagram illustrating a system for a semiconductor final production test of integrated circuit production test according to some embodiments of the present invention. As shown in FIG. 4, system 400 includes a test equipment 410, e.g., an automatic tester, local processor 420, and local storage 430. Tester 410 is configured to perform a final test of packaged devices. Processor 420 is coupled to tester 410 and is configured for controlling tester 410 and analyzing test data. Storage 430 is coupled to processor 420 for storing temporary test data and statistical data. As described further below with reference to FIG. 5, system 400 is configured to perform the final test and analysis. The test data is compressed and distributions are tracked and analyzed locally. It can be seen that system 400 eliminates the need for additional hardware/software for analyzing data.

To remedy the problems associated with the conventional test systems described above, some embodiments of the invention provide dynamic PAT (part average test) limits which constantly adjust according to the real-time empirical data and can reduce or eliminate the problem of having invalid failures and production lines down conditions.

Figure 5:
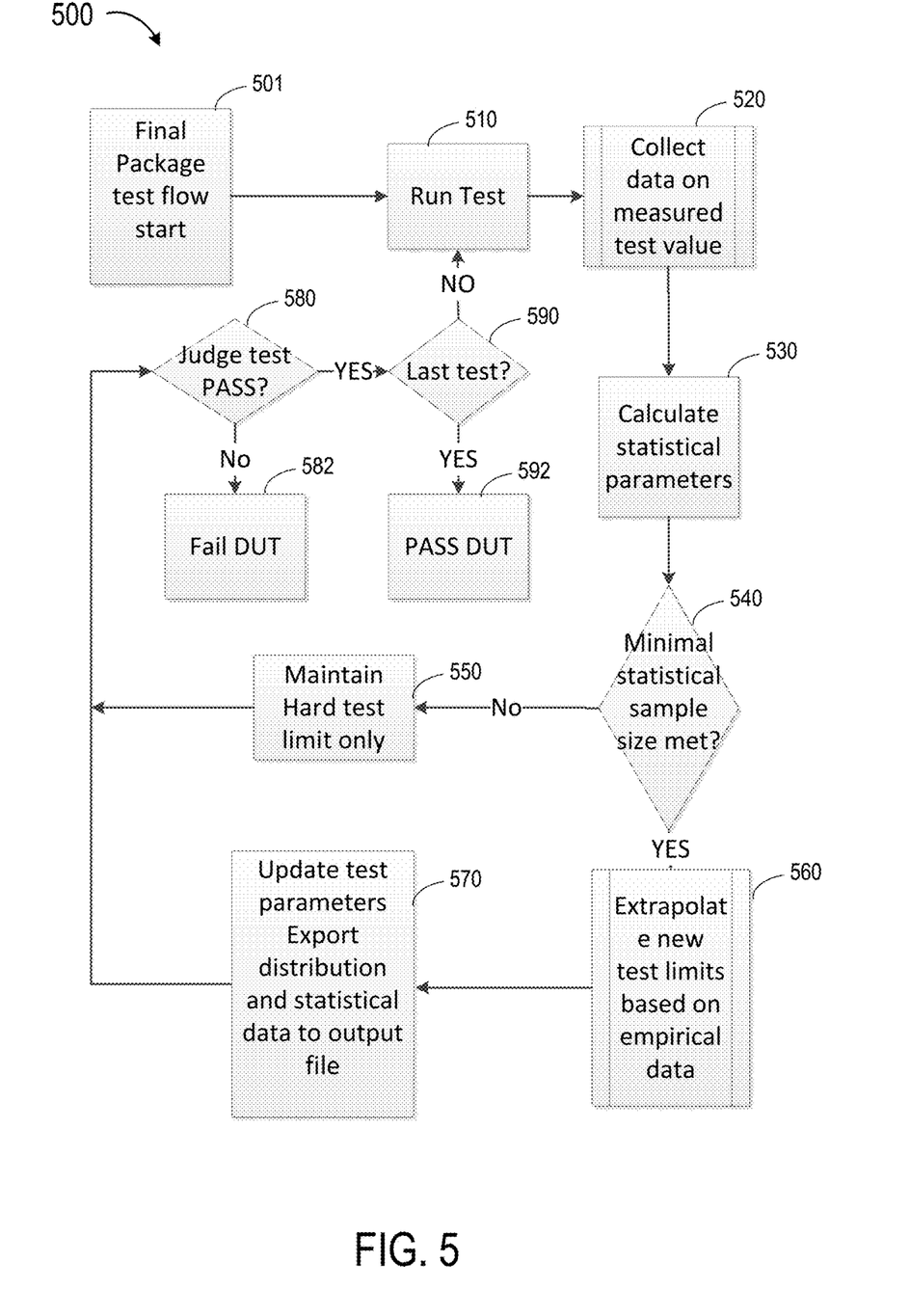
FIG. 5 is a simplified flowchart illustrating a method for a semiconductor final production test of integrated circuit production test according to some embodiments of the present invention.

As illustrated in the flowchart of FIG. 5, according to some embodiments of the invention, a method 500 for testing a plurality of electronic devices, starting at 501, includes performing testing of the device parameters (510). Method 500 can be implemented in a test system such as system 400 illustrated in FIG. 4. The testing can be performed using an automatic tester, which is often configured to test several devices at a time, for example, m device, where m is an integer. As an example, a tester for testing four DUTs (devices under test) in a test socket is used in a specific embodiment. The test can include measuring various device parameters and collecting data on measured test values (520).

As an example, Table I lists uncompressed data for measurements for one specific test.

TABLE I

| | | | Uncompressed Data for Measurements for One Specific Test | | | | |
|---|---|---|---|---|---|---|---|
| DUT | T-No. | Item Name | Unit | L-Lmt. | H-Lmt. | Result | P/F |
| 1 | 5200 | DAC_SNR_10KL | dB | 88.00000 | n/a | 104.093820 | Pass |
| 1 | 5201 | DAC_SNR_10KR | dB | 88.00000 | n/a | 103.610951 | Pass |
| 1 | 5202 | DAC_THD_10KL | dB | n/a | −76.0000 | −93.699835 | Pass |
| 1 | 5203 | DAC_THD_10KR | dB | n/a | −76.0000 | −94.338776 | Pass |
| 1 | 5204 | DAC_SPEC_CHAR | dB | −1.00000 | 1.000000 | 0.00000000 | Pass |
| 1 | 5207 | 3V_SPKR_SNR_L | dB | 50.00000 | 100.0000 | 64.7994546 | Pass |
| 1 | 5208 | 3V_SPKR_SNR_R | dB | 50.00000 | 100.0000 | 64.6054776 | Pass |
| 1 | 5209 | 3V_SPKR_THD_L | dB | −100.000 | −65.0000 | −77.320593 | Pass |
| 1 | 5210 | 3V_SPKR_THD_R | dB | −100.000 | −65.0000 | −77.912715 | Pass |
| 1 | 5211 | SPEAKER_3V_VRMSL | V | 550.000m | 900.000m | 713.32301m | Pass |
| 1 | 5212 | SPEAKER_3V_VRMSR | V | 550.000m | 900.000m | 712.33840m | Pass |
| 1 | 5213 | 5V_SPKR_SNR_L | dB | 55.00000 | 100.0000 | 58.6650604 | Pass |
| 1 | 5214 | 5V_SPKR_SNR_R | dB | 55.00000 | 100.0000 | 58.5224442 | Pass |
| 1 | 5215 | 5V_SPKR_THD_L | dB | −100.000 | −60.0000 | −70.737559 | Pass |
| 1 | 5216 | 5V_SPKR_THD_R | dB | −100.000 | −60.0000 | −74.153807 | Pass |
| 1 | 5217 | SPEAKER_5V_VRMSL | V | 900.000m | 1.200000 | 1.08183184 | Pass |
| 1 | 5218 | SPEAKER_5V_VRMSR | V | 900.000m | 1.200000 | 1.07945886 | Pass |
| 1 | 5219 | SPKR_VOL_L_100 | mV | 1.100000 | 1.700000 | 1.27084759 | Pass |
| 1 | 5220 | SPKR_VOL_R_100 | mV | 1.100000 | 1.700000 | 1.32378664 | Pass |
| 1 | 5221 | SPKR_VOL_L_75 | mV | 280.000m | 480.000m | 387.77887m | Pass |
| 1 | 5222 | SPKR_VOL_R_75 | mV | 280.000m | 480.000m | 387.19062m | Pass |
| 1 | 5223 | SPKR_VOL_L_50 | mV | 14.0000m | 41.0000m | 28.172144m | Pass |
| 1 | 5224 | SPKR_VOL_R_50 | mV | 14.0000m | 41.0000m | 28.080758m | Pass |
| 1 | 5225 | SPKR_VOL_L_25 | mV | 2.00000m | 8.00000m | 4.7363900m | Pass |
| 1 | 5226 | SPKR_VOL_R_25 | mV | 2.00000m | 8.00000m | 4.7055083m | Pass |
| 1 | 5227 | SPKR_VOL_L_0 | mV | 500.000 u | 2.00000m | 1.0970933m | Pass |
| 1 | 5228 | SPKR_VOL_R_0 | mV | 500.000 u | 2.00000m | 1.0684743m | Pass |
| 1 | 5230 | auxL_vbias | volt | 1.550000 | 1.750000 | 1.65474297 | Pass |
| 1 | 5231 | auxR_vbias | volt | 1.550000 | 1.750000 | 1.65321642 | Pass |
| 1 | 5232 | special_char_900mw | P/F | −1.00000 | 1.000000 | 0.00000000 | Pass |
| 1 | 5233 | special_char_V | V | 7.390000 | n/a | 7.72866322 | Pass |
| 1 | 6000 | PLL_LRC_conf0 | Hz | 40.0000K | 50.0000K | 47.976078K | Pass |
| 1 | 6001 | PLL_LRC_conf1 | Hz | 31.0000K | 33.0000K | 31.966521K | Pass |
| 1 | 6002 | PLL_LRC_conf2 | Hz | 23.0000K | 25.0000K | 23.974843K | Pass |
| 1 | 6003 | PLL_LRC_conf3 | Hz | 11.0000K | 13.0000K | 11.987430K | Pass |
| 1 | 6004 | PLL_LRC_conf4 | Hz | 43.0000K | 45.0000K | 44.077972K | Pass |
| 1 | 6005 | PLL_LRC_conf5 | Hz | 31.0000K | 33.0000K | 31.984021K | Pass |
| 1 | 6006 | PLL_LRC_conf6 | Hz | 21.0000K | 23.0000K | 22.038986K | Pass |
| 1 | 6007 | PLL_LRC_conf7 | Hz | 15.0000K | 17.0000K | 16.016010K | Pass |
| 1 | 6008 | PLL_LRC_conf8 | Hz | 10.0000K | 12.0000K | 11.036032K | Pass |

TABLE I-continued

Uncompressed Data for Measurements for One Specific Test

| DUT | T-No. | Item Name | Unit | L-Lmt. | H-Lmt. | Result | P/F |
|---|---|---|---|---|---|---|---|
| 1 | 6009 | PLL_BCLK_conf0 | Hz | 2.80000M | 3.25000M | 3.0702590M | Pass |
| 1 | 6009 | PLL_BCLK_conf1 | Hz | 7.80000M | 8.50000M | 8.1811265M | Pass |
| 1 | 6010 | PLL_BCLK_conf2 | Hz | 2.80000M | 3.25000M | 3.0685062M | Pass |
| 1 | 6011 | PLL_BCLK_conf3 | Hz | 2.80000M | 3.25000M | 3.0685062M | Pass |
| 1 | 6012 | PLL_BCLK_conf4 | Hz | 600.000K | 800.000K | 705.22631K | Pass |
| 1 | 6013 | PLL_BCLK_conf5 | Hz | 3.80000M | 4.25000M | 4.0936785M | Pass |
| 1 | 6014 | PLL_BCLK_conf6 | Hz | 5.40000M | 5.85000M | 5.6420575M | Pass |
| 1 | 6015 | PLL_BCLK_conf7 | Hz | 3.80000M | 4.25000M | 4.0999237M | Pass |
| 1 | 6016 | PLL_BCLK_conf8 | Hz | 2.50000M | 3.10000M | 2.8249825M | Pass |

In method 500 of FIG. 5, the system performs statistical analysis of the measured device parameters for all tested devices to determine statistical data, including mean and standard deviation for each parameter (530). For example, in a test of 19,000 devices (DUTs), raw test data of 250 MB is generated, which is summarized into a 55 KB summary file statistical data. Table II lists part of the summary file showing output file that shows defect rates for each major test.

TABLE II

Output Data of 250 MB (19K Units) Summarized Into 55 KB of Data, Real-Time Continuous
Current test count = 19020

| | |
|---|---|
| Normalized percent fail Continuity | test = 0.420610% |
| Normalized percent fail Leakage2 | test = 0.005280% |
| Normalized percent fail SPEAKER_DC | test = 0.000000% |
| Normalized percent fail RAM | test = 0.000000% |
| Normalized percent fail DAC_MASTERMODE | test = 0.015840% |
| Normalized percent fail PLL_DAC_VOL | test = 4.684199% |
| Normalized percent fail SPKR_Pop | test = 0.011081% |
| Normalized percent fail Power_testing | test = 0.000000% |
| Normalized percent fail Run_Scan_Chain | test = 0.016623% |

Table III lists part of the summary file showing the number of devices tested and the number of failed devices for each test.

TABLE III

Output File Data Summary Content - Summary of How Much Product Went Into Each Test and Fail Count for Each Category

| | |
|---|---|
| total number of dice into Continuity | test = 19020 |
| total number of dice into Leakage | test = 0 |
| total number of dice into Leakage2 | test = 18940 |
| total number of dice into SPEAKER_DC | test = 18939 |
| total number of dice into RAM | test = 18939 |
| total number of dice into ulaw_loopback | test = 0 |
| total number of dice into ADC_SINAD | test = 0 |
| total number of dice into DAC_MASTERMODE | test = 18939 |
| total number of dice into DAC_SINAD | test = 0 |
| total number of dice into PLL_DAC_VOL | test = 18936 |
| total number of dice into PLL_Test_VIL_VIH | test = 0 |
| total number of dice into SPKR_Pop | test = 18049 |
| total number of dice into Power_testing | test = 18049 |
| total number of dice into Zin_mic_noGains | test = 0 |
| total number of dice into Run_Scan_Chain | test = 18047 |
| total number of dice into Special_Char | test = 0 |
| total number of dice fail Continuity | test = 80 |
| total number of dice fail Leakage | test = 0 |
| total number of dice fail Leakage2 | test = 1 |
| total number of dice fail SPEAKER_DC | test = 0 |
| total number of dice fail RAM | test = 0 |
| total number of dice fail ulaw_loopback | test = 0 |
| total number of dice fail ADC_SINAD | test = 0 |
| total number of dice fail DAC_MASTERMODE | test = 3 |
| total number of dice fail DAC_SINAD | test = 0 |
| total number of dice fail PLL_DAC_VOL | test = 887 |
| total number of dice fail PLL_Test_VIL_VIH | test = 0 |
| total number of dice fail SPKR_Pop | test = 2 |
| total number of dice fail Power_testing | test = 0 |
| total number of dice fail Zin_mic_noGains | test = 0 |
| total number of dice fail Run_Scan_Chain | test = 3 |
| total number of dice fail Special_Char | test = 0 |

Table IV lists part of the summary file showing the number of failed devices for each subtests within each major test category.

TABLE IV

Output File Data Summary Content - Breakdown of Subtests That Fail Within Each Major Test Category

| | |
|---|---|
| Detail fail info die_ulaw_thd_fail = | 0 |
| Detail fail info die_ulaw_amp_fail = | 0 |
| Detail fail info die_ulaw_5db_fail = | 0 |
| Detail fail info die_ulaw_micbias_fail = | 0 |
| Detail fail info die_adc_snr_fail = | 0 |
| Detail fail info die_adc_thd_fail = | 0 |
| Detail fail info die_dac_snr_fail = | 16 |
| Detail fail info die_dac_thd_fail = | 336 |
| Detail fail info die_dac_spkr3v_snr_fail = | 391 |
| Detail fail info die_dac_spkr3v_thd_fail = | 320 |
| Detail fail info die_dac_spkr_mute_fail = | 0 |
| Detail fail info die_dac_master_fail = | 3 |
| Detail fail info die_pll_csb0_fail = | 0 |
| Detail fail info die_pll_bclk0_fail = | 3 |
| Detail fail info die_pll_fs0_fail = | 3 |
| Detail fail info die_pll_csb1_fail = | 0 |
| Detail fail info die_pll_bclk1_fail = | 5 |
| Detail fail info die_pll_fs1_fail = | 5 |
| Detail fail info die_pll_csb2_fail = | 0 |
| Detail fail info die_pll_bclk2_fail = | 3 |
| Detail fail info die_pll_fs2_fail = | 3 |
| Detail fail info die_pll_csb3_fail = | 0 |
| Detail fail info die_pll_bclk3_fail = | 3 |
| Detail fail info die_pll_fs3_fail = | 3 |
| Detail fail info die_pll_csb4_fail = | 0 |
| Detail fail info die_pll_bclk4_fail = | 2 |
| Detail fail info die_pll_fs4_fail = | 2 |
| Detail fail info die_pll_csb5_fail = | 0 |
| Detail fail info die_pll_bclk5_fail = | 1 |
| Detail fail info die_pll_fs5_fail = | 1 |
| Detail fail info die_pll_csb6_fail = | 0 |
| Detail fail info die_pll_bclk6_fail = | 1 |
| Detail fail info die_pll_fs6_fail = | 1 |
| Detail fail info die_pll_csb7_fail = | 0 |
| Detail fail info die_pll_bclk7_fail = | 1 |
| Detail fail info die_pll_fs7_fail = | 1 |
| Detail fail info die_pll_csb8_fail = | 0 |
| Detail fail info die_pll_bclk8_fail = | 1 |
| Detail fail info die_pll_fs8_fail = | 1 |

TABLE IV-continued

Output File Data Summary Content - Breakdown of Subtests That Fail Within Each Major Test Category

| | |
|---|---|
| Detail fail info die_spkr_Vrms_fail = | 10 |
| Detail fail info die_spkr_5v_snr_fail = | 150 |
| Detail fail info die_spkr_5v_thd_fail = | 11 |
| Detail fail info die_spkr_5v_Vrms_fail = | 10 |
| Detail fail info die_spkr_5v_Vrms100_fail = | 12 |
| Detail fail info die_spkr_5v_Vrms75_fail = | 10 |
| Detail fail info die_spkr_5v_Vrms50_fail = | 9 |
| Detail fail info die_spkr_5v_Vrms25_fail = | 10 |
| Detail fail info die_spkr_5v_Vrms0_fail = | 13 |
| Detail fail info die_dac_aux_fail = | 10 |
| Detail fail info die_dac_spec7_900mw_fail = | 12 |
| Detail fail info die_vddc_stby_fail = | 0 |
| Detail fail info die_vddb_stby_fail = | 0 |
| Detail fail info die_avdd_stby_fail = | 0 |
| Detail fail info die_spkvdd_stby_fail = | 0 |
| Detail fail info die_vddc_active_fail = | 0 |
| Detail fail info die_vddb_active_fail = | 0 |
| Detail fail info die_avdd_active_fail = | 0 |
| Detail fail info die_spkvdd_active_fail = | 0 |
| Detail fail info die_Rin_Auxr_fail = | 0 |
| Detail fail info die_Rin_Auxl_fail = | 0 |
| Detail fail info die_Rin_rip_fail = | 0 |
| Detail fail info die_Rin_rin_fail = | 0 |
| Detail fail info die_Rin_lip_fail = | 0 |
| Detail fail info die_Rin_lin_fail = | 0 |

After each test, the system stores only the statistical data, and not the measured device parameters as shown in Table I. As shown above, the statistical data can include a total number of device tested, a number of failed devices, and a percentage of failed devices. In some embodiments, the statistical data can include histograms of device parameters distributions.

As an example, Table V lists histogram data for measured parameter values for a particular test—the signal-to-noise ratio (SNR) for a digital-to-analog converter (DAC).

TABLE V

Output File Data Summary Content - Histogram Information Per Test

| | |
|---|---|
| HP SNR right channel histogram less than 85 dB occurences | 12 (fails) |
| HP SNR right channel histogram 85.0 dB + 0.5 dB occurences | 0 |
| HP SNR right channel histogram 85.5 dB + 0.5 dB occurences | 0 |
| HP SNR right channel histogram 86.0 dB + 0.5 dB occurences | 0 |
| HP SNR right channel histogram 86.5 dB + 0.5 dB occurences | 0 |
| HP SNR right channel histogram 87.0 dB + 0.5 dB occurences | 0 |
| HP SNR right channel histogram 87.5 dB + 0.5 dB occurences | 0 |
| HP SNR right channel histogram 88.0 dB + 0.5 dB occurences | 0 |
| HP SNR right channel histogram 88.5 dB + 0.5 dB occurences | 0 |
| HP SNR right channel histogram 89.0 dB + 0.5 dB occurences | 0 |
| HP SNR right channel histogram 89.5 dB + 0.5 dB occurences | 0 |
| HP SNR right channel histogram 90.0 dB + 0.5 dB occurences | 0 |
| HP SNR right channel histogram 90.5 dB + 0.5 dB occurences | 0 |
| HP SNR right channel histogram 91.0 dB + 0.5 dB occurences | 0 |
| HP SNR right channel histogram 91.5 dB + 0.5 dB occurences | 0 |
| HP SNR right channel histogram 92.0 dB + 0.5 dB occurences | 0 |
| HP SNR right channel histogram 92.5 dB + 0.5 dB occurences | 0 |
| HP SNR right channel histogram 93.0 dB + 0.5 dB occurences | 0 |
| HP SNR right channel histogram 93.5 dB + 0.5 dB occurences | 0 |
| HP SNR right channel histogram 94.0 dB + 0.5 dB occurences | 0 |
| HP SNR right channel histogram 94.5 dB + 0.5 dB occurences | 0 |
| HP SNR right channel histogram 95.0 dB + 0.5 dB occurences | 0 |
| HP SNR right channel histogram 95.5 dB + 0.5 dB occurences | 1 |
| HP SNR right channel histogram 96.0 dB + 0.5 dB occurences | 10 |
| HP SNR right channel histogram 96.5 dB + 0.5 dB occurences | 14 |
| HP SNR right channel histogram 97.0 dB + 0.5 dB occurences | 50 |
| HP SNR right channel histogram 97.5 dB + 0.5 dB occurences | 95 |
| HP SNR right channel histogram 98.0 dB + 0.5 dB occurences | 1325 |
| HP SNR right channel histogram 98.5 dB + 0.5 dB occurences | 2065 |
| HP SNR right channel histogram 99.0 dB + 0.5 dB occurences | 3278 |
| HP SNR right channel histogram 99.5 dB + 0.5 dB occurences | 4235 |
| HP SNR right channel histogram 100.0 dB + 0.5 dB occurences | 5190 |
| HP SNR right channel histogram 100.5 dB + 0.5 dB occurences | 6239 |
| HP SNR right channel histogram 101.0 dB + 0.5 dB occurences | 7400 |
| HP SNR right channel histogram 101.5 dB + 0.5 dB occurences | 7832 |
| HP SNR right channel histogram 102.0 dB + 0.5 dB occurences | 8323 |
| HP SNR right channel histogram 102.5 dB + 0.5 dB occurences | 8500 |
| HP SNR right channel histogram 103.0 dB + 0.5 dB occurences | 8355 |
| HP SNR right channel histogram 103.5 dB + 0.5 dB occurences | 7932 |
| HP SNR right channel histogram 104.0 dB + 0.5 dB occurences | 7329 |
| HP SNR right channel histogram 104.5 dB + 0.5 dB occurences | 6123 |
| HP SNR right channel histogram 105.0 dB + 0.5 dB occurences | 5220 |
| HP SNR right channel histogram 105.5 dB + 0.5 dB occurences | 4155 |
| HP SNR right channel histogram 106.0 dB + 0.5 dB occurences | 3322 |
| HP SNR right channel histogram 106.5 dB + 0.5 dB occurences | 2014 |
| HP SNR right channel histogram 107.0 dB + 0.5 dB occurences | 1329 |
| HP SNR right channel histogram 107.5 dB + 0.5 dB occurences | 88 |
| HP SNR right channel histogram 108.5 dB + 0.5 dB occurences | 45 |
| HP SNR right channel histogram 109.0 dB + 0.5 dB occurences | 12 |
| HP SNR right channel histogram 109.5 dB + 0.5 dB occurences | 9 |
| HP SNR right channel histogram 110.0 dB + 0.5 dB occurences | 3 |
| HP SNR right channel histogram 110.5 dB + 0.5 dB occurences | 0 |
| HP SNR right channel histogram 111.0 dB + 0.5 dB occurences | 0 |
| HP SNR right channel histogram 111.5 dB + 0.5 dB occurences | 0 |
| HP SNR right channel histogram more than 112.0 dB occurences | 0 |

Figure 6:
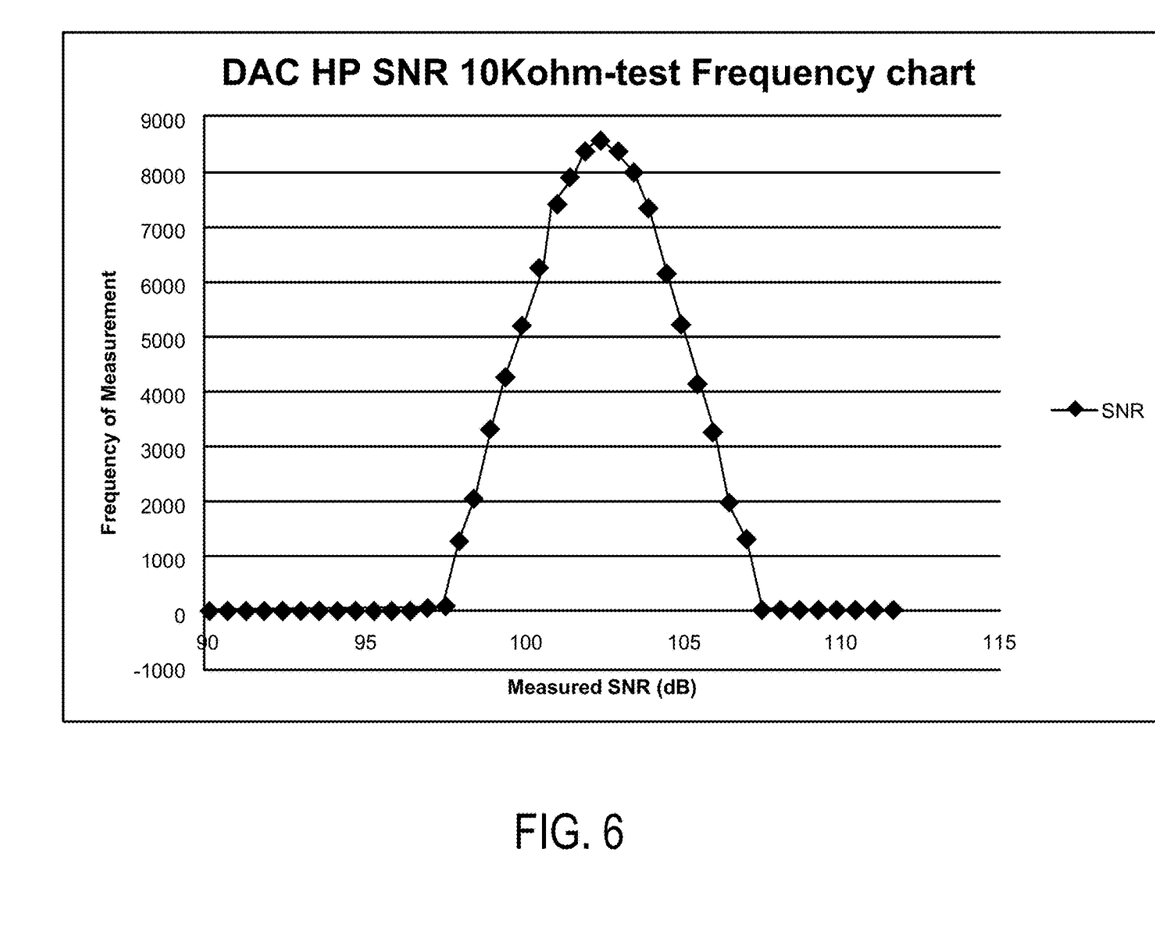
FIG. 6 is a histogram plot illustrating a distribution of measure values for a device parameter. In this specific example a head phone digital to analog converter signal to noise ratio (SNR) is plotted along a horizontal axis representing SNR values from 90 to 115.

FIG. 6 is a histogram plot illustrating a distribution of measure values for a device parameter. In this specific example, the data is listed in the histogram of Table V a head phone (HP) digital-to-analog converter (DAC) signal to noise ratio (SNR) is plotted. In FIG. 6, the vertical axis is the frequency of measurement, or the number of devices. The horizontal axis shows signal-to-noise ratio (SNR) values from 90 to 115. From the histogram data in Table V and the distribution plot in FIG. 6, a mean and a standard deviation can be derived.

For example, Table VI lists the mean, standard deviation, upper and lower limits based on mean plus and minus three standard deviations of each parameter, and mean plus and minus six standard deviations of each parameter.

TABLE VI

Output File Data Summary Content - Test Parameter Statistical Data

| | |
|---|---|
| DAC HP SNR Mean | 103 dB |
| DAC HP SNR Stdev | 1.66 dB |
| DAC HP SNR +/− 3 sigma | 98.02 dB, 107.98 dB |
| DAC HP SNR +/− 6 DPAT limit | 93.04 dB, 112.96 dB |
| DAC HP THD Mean | −79.82 dB |
| DAC HP THD Stdev | 2.9 dB |
| DAC HP THD +/− 3 sigma | −87.9 dB, −70.5 dB |
| DAC HP THD +/− 6 DPAT limit | −96.6 dB, −61.8 dB |
| DAC SPEAKER SNR Mean | 78.5 dB |
| DAC SPEAKER SNR Stdev | 2.45 dB |
| DAC SPEAKER SNR +/− 3 sigma | 71.15 dB, 85.85 dB |
| DAC SPEAKER SNR +/− 6 DPAT limit | 63.8 dB, 93.2 dB |
| DAC SPEAKER THD Mean | −80.1 dB |
| DAC SPEAKER THD Stdev | −1.95 dB |
| DAC SPEAKER THD +/− 3 sigma | −85.95 dB, −74.25 dB |
| DAC SPEAKER THD +/− 6 DPAT limit | −91.8 dB, −68.4 dB |
| DAC SPEAKER VOL Vrms Mean | 2.16 V |
| DAC SPEAKER VOL Vrms Stdev | 0.009 V |
| DAC SPEAKER VOL Vrms +/− 3 sigma | 2.133 V, 2.187 V |
| DAC SPEAKER VOL Vrms +/− 6 DPAT limit | 2.106 V, 2.214 V |
| ISB Mean | 9.9 uA |
| ISB Stdev | 0.85 uA |
| ISB +/− 3 sigma | 7.35 uA, 12.45 uA |
| ISB +/− 6 DPAT limit | 4.8 uA, 15.0 uA |
| PLL 48 KHZ FS Output CLK mean | 47.97 KHz |
| PLL 48 KHZ FS Output CLK Stdev | 0.005 Khz |

TABLE VI-continued

Output File Data Summary Content -
Test Parameter Statistical Data

| | |
|---|---|
| PLL 48 KHZ FS Output CLK +/− 3 sigma | 47.955 Khz, 47.985 Khz |
| PLL 48 KHZ FS Output CLK +/− 6 sigma | 47.94 Khz, 48.0 Khz |
| Input Leakage Mean | 2.35 uA |
| Input Leakage Stdev | 0.2 uA |
| Input Leakage +/− 3 sigma | 1.75 uA, 2.95 uA |
| Input Leakage +/− 6 DPAT limit | 1.15 uA, 3.55 uA |

In method 500, statistical data based on measured raw data from a first group of devices of a minimal statistical sample size are used to start setting dynamic pass/fail limits. For example, the minimal statistical sample size can be the first N devices, where N is an integer. For example, in an embodiment, the minimal statistical sample size N can be 500 DUTs, or 1000 DUTS, etc. Here, N can be selected to produce a statistically meaningful distribution of the test devices.

In embodiments of the invention, for the first N devices, where N is an integer, each test further includes determining pass or fail of each device based on preset pass/fail limits for the device parameter. The integer N for the first N devices is selected to provide a sufficiently large number of tested devices for determining new statistical data of the device parameters. For example, N can represent a minimal statistical sample size are that can be used to determine new pass/fail limits. After the first N device, each subsequent test further includes determining new pass/fail limits for each device parameter based on the updated mean and standard deviation. The system then determines pass or fail of each device based on the new pass/fail limits for each device parameter.

Figure 7:
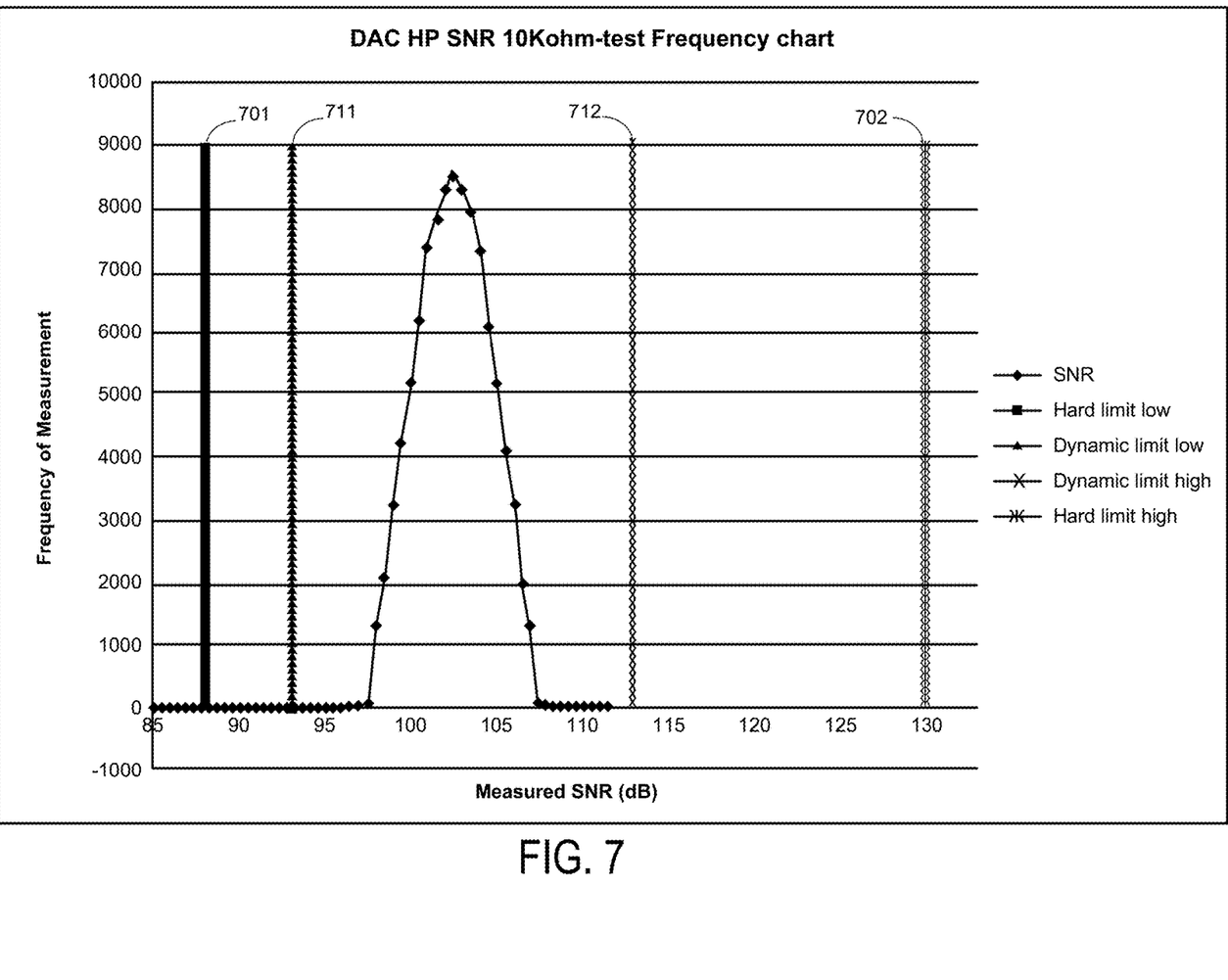
FIG. 7 is a histogram plot illustrating a distribution of measure values for a device parameter, similar to that in FIG. 6, and also illustrates static and dynamic pass/fail limits according to embodiments of the present invention.

FIG. 7 is a histogram plot illustrating a distribution of measure values for a device parameter showing new pass/fail limits. It can be seen that the histogram in FIG. 7 is similar to the histogram in FIG. 6, in which data for a head phone (HP) digital-to-analog converter (DAC) signal to noise ratio (SNR) is plotted. In FIG. 7, the vertical axis is the frequency of measurement, or the number of devices. The horizontal axis shows signal-to-noise ratio (SNR) values from 90 to 115. In FIG. 7, the old pass/fail limits are marked as 701 and 702, and the new pass/fail limits are marked 711 and 712. In some embodiments, new pass/fail limits are determined dynamically after every test. For example, in a test having a test socket for testing four devices simultaneously, the dynamic pass/fail limits are set after each socket of devices are tested. Thus, test data analysis is carried out on a real-time basis. Only statistical data are kept and stored. There is no need to transfer large amounts of raw measurement data.

Referring back to FIG. 5, method 500 includes determining if the minimal statistical sample size has been met (540). If not, the preset hard test limit of the device parameter value for pass/fail is maintained (550). The test includes determining pass or fail of each device based on preset hard pass/fail limits for each device parameter (580). If the measure device parameter is not within the preset hard pass/fail limits, the device is marked as a failing DUT (582).

In FIG. 5, if the minimal statistical sample size, e.g., N, has been met (560). As an example, N can be set at 500 DUTs. For each additional test after the Nth device, which can include up to m devices in a test socket, new pass/fail limits for each device parameter are determined based on the updated mean and standard deviation. In some embodiments of the above system, the new pass/fail limits for each device parameter are based on the updated mean plus and minus six standard deviations of each parameter. In some embodiments, the new pass/fail limits for each device parameter are based on the updated mean plus and minus three standard deviations of each parameter.

In method 500 in FIG. 5, the device is determined to pass or fail of each device based on the new pass/fail limits for each device parameter (580). Thus, the pass/fail test limits are dynamically calculated based on measurement data.

In method 500, it is determined if all tests for all devices have been tested (590), and the device passing all tests are identified (592).

Method 500 can also include updating test parameters and export distribution and statistical data to output file (570). It is noted that the system does not stored all the raw measurement data. This can greatly reduce the storage requirements and process overhead. Table VII below lists the file size reduction enabled by the method based on some embodiments. It can be seen that the file size for device testing can be reduced by approximately 450 times for different numbers of device tested.

TABLE VII

Data File Size Savings for Different Production Size Count

| DUT count | Test data file size (MB) | Data file size summaries (KB) | Actual reduced data size in MB (summaries outputted every 500 DUTs) | File size reduced by X amount | Approx time needed for 1 ATE to test (days) |
|---|---|---|---|---|---|
| 10,000 | 500 | 55 | 1.1 | 455 | 0.3 |
| 100,000 | 5000 | 55 | 11 | 455 | 3 |
| 1,000,000 | 50000 | 55 | 110 | 455 | 30 |
| 10,000,000 | 500000 | 55 | 1100 | 455 | 300 |

Thus, according to embodiments of the invention, a system and method for effective device testing are described above. Depending on the embodiments, the system and method can offer various advantages in, for example, efficient data management, real time data analysis, and dynamic test limits adjustment, as described further below.

Efficient Data Management

Automated test equipment has an option to turn on or turn off data output. The storage limitations and engineering staff needed to analyze all the data are not always available. Sometimes the user may choose to turn off the data output. Regardless of whether data is turned on or off by the ATE, embodiments of this invention can output and analyze data in real time. No added test time cost is incurred. In many cases, data analysis time is shorter than testing time. As an example, Table I above shows the actual data printed out for one particular test. This data produced by one test and one DUT amounts to 50 KB of data. Given there any many tests parameters in a production flow for full test coverage, the amount of data produced by a small run of 20,000 units (approximately 13 hours of time on one ATE) will produce a data file of 1.0 GB of data. Embodiments of this invention can crunch and analyze data in real time after every DUT socketing. So 20,000 units of data which does require 1.0 GB of data can be summarized with no data loss in only 55 KB of data, as shown in the tables above. In some embodiments, the data summaries are always in the 55 KB of data size no matter how many units were tested or how large the original data file is. Typically summary files are outputted every 500 DUTs which gives a data reduction of about 450 to 1.

Real Time Data Analysis

The test results are summarized as distributions as seen in Tables I to VII. These figures are the result of testing 20,000 units. The raw measurement data is listed in Table I. Analysis of the measured data is carried out in real time as the test is being performed. Each individual measurement is reported and placed in a Gaussian distribution which is outputted as described above. Distributions of all test parameters are rolled up into the summary output file.

Dynamic Test Limits Adjustment

The dynamic adjustment of test limits can increase the quality of the outgoing product. Quality is increased by rendering what normally would be a "good" part bad, because it is "statistically" different in relation to other parts it is compared against. Dynamic can be defined by the user and configurable to screen any percentage of units deemed necessary. In some embodiments, "+/−3 sigma (standard deviations)" or "+/−6 sigma" are used to set the pass/fail limits to eliminate otherwise good devices. In some embodiments, dynamic adjustment of test limits can be performed for every single test. In other embodiments, dynamic adjustment of test limits can be initialed by end-customer defined specifications. Dynamic adjustment of test limits can achieve the desired test results. In some cases, dynamic limits are narrower than preset hard test limits. In other words, the dynamically adjusted test limits can have more strict definition of "good" die. Therefore, device failure through the device lifetime can be reduced. For example, in an embodiment, using the "+/−6 sigma" dynamic part average test (DPAT) levels are used to limit DPM rates (defects per million) to ~3.5. In some cases, DPM rates can be determined by field failures based on customer reported data. In other cases, vendor-controlled experiments of device life test under stress conditions can be used to test the devices.

Although specific embodiments of the invention are described above, the description should not be taken as limiting the scope of the invention. It is understood that the examples and embodiments described herein are for illustrative purposes only and that various modifications or changes can be made in light thereof.

What is claimed is:

1. A system for of testing a plurality of electronic devices, comprising:
   A testing equipment;
   a processor coupled to the testing equipment; and
   a storage device coupled to the processor;
   wherein the system is configured to:
   perform tests of up to m devices at a time to measure device parameters on a device tester configured to test up to m device at a time, where m is an integer;
   after each test, perform statistical analysis of measured device parameters for all tested devices to determine updated statistical data, including updated mean and standard deviation for each parameter; and
   store only the updated statistical data, and not the measured device parameters;
   for first N devices, where N is an integer, each test further including determining pass or fail of each device based on preset pass/fail limits for the device parameters;
   after the first N devices, each subsequent test further including:
   determining new pass/fail limits for each device parameter based on the updated mean and standard deviation; and
   determining pass or fail of each device based on the new pass/fail limits for each device parameter.

2. The system of claim 1, wherein the new pass/fail limits for each device parameter are based on the updated mean plus and minus six standard deviations of each parameter.

3. The system of claim 1, wherein the new pass/fail limits for each device parameter are based on the updated mean plus and minus three standard deviations of each parameter.

4. The system of claim 1, wherein the integer N is selected to provide a sufficiently large number of tested devices for determining new statistical data of the device parameters.

5. The system of claim 1, wherein the first N devices comprises 50-500 devices.

6. The system of claim 1, wherein the first N devices comprises 500-3000 devices.

7. The system of claim 1, wherein the statistical data comprises total number of device tested, number of failed devices, and percentage of failed device.

8. The system of claim 1, wherein the statistical data comprises histograms of device parameters distributions.

9. The system of claim 1, wherein the statistical data comprises the updated mean plus and minus six standard deviations of each parameters.

10. The system of claim 1, wherein the statistical data comprises the updated mean plus and minus three standard deviations of each parameters.

11. A method for of testing a plurality of electronic devices, comprising:
    performing tests of up to m devices at a time to measure device parameters on a device tester configured to test up to m device at a time, where m is an integer,
    after each test, performing statistical analysis of measured device parameters for all tested devices to determine statistical data, including updated mean and standard deviation for each parameter; and
    storing only the statistical data, and not the measured device parameters;
    determining new pass/fail limits for each device parameter based on the updated mean and standard deviation; and
    determining pass or fail of each device based on the new pass/fail limits for each device parameter;
    for first N devices, where N is an integer, each test further including determining pass or fail of each device based on preset pass/fail limits for each device parameter; and
    after the first N devices, each subsequent test further including:
    determining new pass/fail limits for each device parameter based on the updated mean and standard deviation; and
    determining pass or fail of each device based on the new pass/fail limits for each device parameter.

12. The method of claim 11, wherein the new pass/fail limits for each device parameter are based on the updated mean plus and minus six standard deviations of each parameters.

13. The method of claim 11, wherein the new pass/fail limits for each device parameter are based on the updated mean plus and minus three standard deviations of each parameters.

14. The method of claim 11, wherein the integer N is selected to provide a sufficiently large number of tested devices for determining new statistical data of device parameters.

15. The method of claim 11, wherein the first N devices comprises 50-500 devices.

16. The method of claim 11, wherein the first N devices comprises 500-3000 devices.

17. The method of claim 11, wherein the statistical data comprises total number of device tested, number of failed devices, and percentage of failed device.

18. The method of claim 11, wherein the statistical data comprises histograms of device parameters distributions.

19. The method of claim 11, wherein the statistical data comprises the updated mean plus and minus six standard deviations of each parameters.

\* \* \* \* \*